(12) United States Patent
Kim et al.

(10) Patent No.: US 10,305,028 B2
(45) Date of Patent: May 28, 2019

(54) ELECTRONIC DEVICE INCLUDING AN UNDER LAYER AND A PERPENDICULAR MAGNETIC ANISOTROPY INCREASING LAYER HAVING A DIFFERENT CRYSTAL STRUCTURE FROM THE UNDER LAYER

(71) Applicant: SK hynix Inc., Icheon-si (KR)

(72) Inventors: Yang-Kon Kim, Icheon-si (KR);
Ku-Youl Jung, Icheon-si (KR);
Jong-Koo Lim, Icheon-si (KR);
Jae-Hyoung Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/910,427

(22) Filed: Mar. 2, 2018

(65) Prior Publication Data

US 2018/0323368 A1 Nov. 8, 2018

(30) Foreign Application Priority Data

May 4, 2017 (KR) .................. 10-2017-0056761

(51) Int. Cl.
| | | |
|---|---|---|
| *H01L 43/08* | (2006.01) | |
| *H01L 27/22* | (2006.01) | |
| *H01L 43/10* | (2006.01) | |

(52) U.S. Cl.
CPC ............ *H01L 43/08* (2013.01); *H01L 27/222* (2013.01); *H01L 43/10* (2013.01)

(58) Field of Classification Search
CPC ........ H01L 43/08; H01L 43/10; H01L 27/222
See application file for complete search history.

(56) References Cited

U.S. PATENT DOCUMENTS

| | | | |
|---|---|---|---|
| 2013/0155759 A1* | 6/2013 | Kao ....................... | G11C 11/14 365/158 |
| 2014/0103469 A1 | 4/2014 | Jan et al. | |
| 2015/0008547 A1* | 1/2015 | Pi .......................... | H01L 43/04 257/421 |
| 2016/0099287 A1 | 4/2016 | Nagamine et al. | |

FOREIGN PATENT DOCUMENTS

KR  10-2009-0031994  3/2009

* cited by examiner

*Primary Examiner* — Selim U Ahmed
(74) *Attorney, Agent, or Firm* — Perkins Coie LLP

(57) ABSTRACT

An electronic device may include a semiconductor memory, and the semiconductor memory may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer.

20 Claims, 8 Drawing Sheets

ELECTRONIC DEVICE INCLUDING AN UNDER LAYER AND A PERPENDICULAR MAGNETIC ANISOTROPY INCREASING LAYER HAVING A DIFFERENT CRYSTAL STRUCTURE FROM THE UNDER LAYER

CROSS-REFERENCE TO RELATED APPLICATION

This patent document claims priority of Korean Patent Application No. 10-2017-0056761, entitled "ELECTRONIC DEVICE" and filed on May 4, 2017, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device may include a semiconductor memory, and the semiconductor memory may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer.

Implementations of the above electronic device may include one or more the following.

The under layer may include a material having a crystal structure of NaCl. The under layer may include a metal oxide having a crystal structure of NaCl. The under layer may include MgO, or ZnO, or a combination thereof. The perpendicular magnetic anisotropy increasing layer may include a material having a face centered cubic (FCC) crystal structure. The perpendicular magnetic anisotropy increasing layer may include a metal nitride having a face centered cubic (FCC) crystal structure. The perpendicular magnetic anisotropy increasing layer may include TiN, ZrN, HfN, or MoN, or a combination thereof. The semiconductor memory may further include a buffer layer disposed below the perpendicular magnetic anisotropy increasing layer and operating to facilitate crystal growth of the layers disposed over the buffer layer. The buffer layer may include a material having a hexagonal close packed (HCP) crystal structure. The buffer layer may include Mg, Zr, Hf, Ru, or Os, or a combination thereof.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device including a semiconductor memory, wherein the semiconductor memory may include: a substrate; memory cells formed over the substrate, each memory cell including a magnetic layer, an under layer disposed below the magnetic layer and a perpendicular magnetic anisotropy increasing layer disposed below the under layer and enhancing perpendicular magnetic anisotropy of the free layer; and switching elements formed over the substrate and coupled to the memory cells, to select or de-select the memory cells, wherein the perpendicular magnetic anisotropy increasing layer may include a material having a different crystal structure from the under layer.

Implementations of the above electronic device may include one or more the following.

Each memory cell may include a magnetic tunnel junction (MTJ) structure that includes the magnetic layer, the under layer and the perpendicular magnetic anisotropy increasing layer. The under layer may include a material having a crystal structure of NaCl. The under layer may include a metal oxide having a crystal structure of NaCl. The under layer may include MgO, or ZnO, or a combination thereof. The perpendicular magnetic anisotropy increasing layer may include a material having a face centered cubic (FCC) crystal structure. The perpendicular magnetic anisotropy increasing layer may include a metal nitride having a face centered cubic (FCC) crystal structure. The perpendicular magnetic anisotropy increasing layer may include TiN, ZrN, HfN, or MoN, or a combination thereof. Each memory cells may further include a buffer layer disposed below the perpendicular magnetic anisotropy increasing layer and operating to facilitate crystal growth of the layers disposed over the buffer layer. The buffer layer may include a material having a hexagonal close packed (HCP) crystal structure. The buffer layer may include Mg, Zr, Hf, Ru, or Os, or a combination thereof.

In another aspect, an electronic device is provided to comprise a semiconductor memory that comprises: an MTJ (Magnetic Tunnel Junction) structure including a first ferromagnetic material layer exhibiting a magnetization perpendicular to the first ferromagnetic material layer with a first value of a perpendicular magnetic anisotropy, a second ferromagnetic material layer exhibiting a magnetization perpendicular to the second ferromagnetic material layer, and a tunnel barrier layer interposed between the first and second ferromagnetic material layers; and an under layer forming an interface with the first ferromagnetic material layer and including a material having a crystal structure of NaCl to increase the first value of the perpendicular magnetic anisotropy to a second value.

In some implementations, the under layer includes a metal oxide having the crystal structure of NaCl. In some implementations, the electronic device further comprises: a perpendicular magnetic anisotropy increasing layer disposed below the under layer and including a material having a different crystal structure from the under layer. In some implementations, the perpendicular magnetic anisotropy increasing layer includes a material having a face centered cubic (FCC) crystal structure. In some implementations, the perpendicular magnetic anisotropy increasing layer includes a metal nitride having a face centered cubic (FCC) crystal structure. In some implementations, the semiconductor memory further includes a buffer layer disposed below the under layer and including a material having a hexagonal close packed (HCP) crystal structure.

These and other aspects, implementations and associated advantages are described in greater detail in the drawings, the description and the claims.

DETAILED DESCRIPTION

Figure 1:
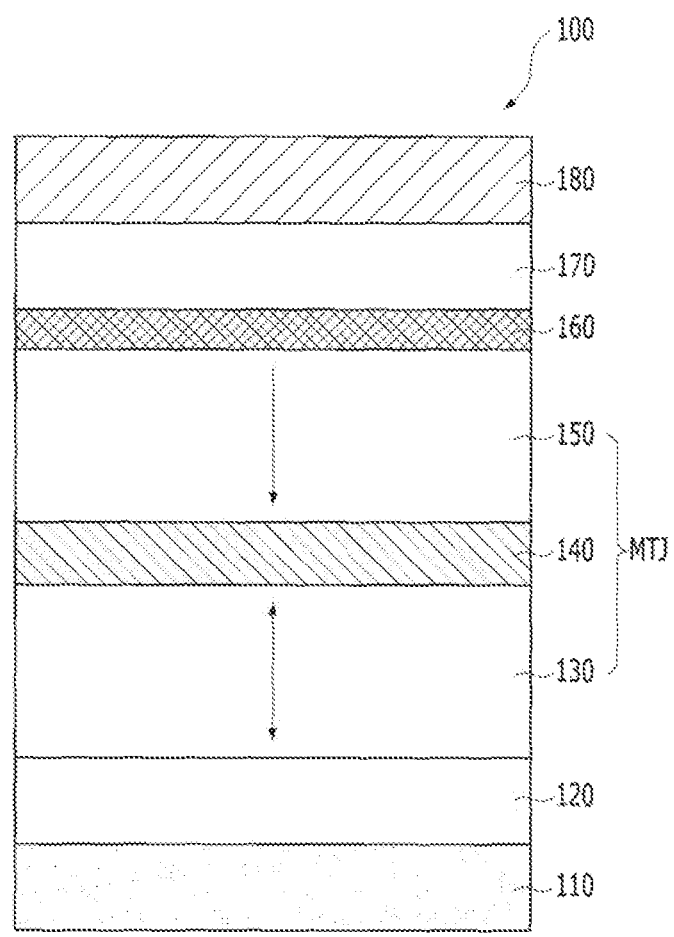
FIG. 1 is a cross-sectional view illustrating a variable resistance element in accordance with an implementation of the present disclosure.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer substrate may not reflect all layers present in that particular multilayer substrate (e.g., one or more additional layers can be present between two illustrated layers). As a specific example, when a first layer in a described or illustrated multi-layer substrate is referred to as being "on"

or "over" a second layer or "on" or "over" a substrate, the first layer may be directly formed on the second layer or the substrate but may also represent a substrate where one or more other intermediate layers may exist between the first layer and the second layer or the substrate.

A variable resistance element may mean or include an element capable of being switched between different resistance states in response to an applied bias (for example, a current or voltage). The variable resistance element may store different data according to the resistance state and thus, the variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may include an MTJ (Magnetic Tunnel Junction) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element.

FIG. 1 is a cross-sectional view illustrating a variable resistance element in accordance with an implementation of the present disclosure.

Referring to FIG. 1, a variable resistance element 100 in accordance with the implementation of the present disclosure may include an MTJ structure including a free layer 130 having a variable magnetization direction, a pinned layer 150 having a fixed magnetization direction, and a tunnel barrier layer 140 interposed between the free layer 130 and the pinned layer 150.

The free layer 130 may have a variable magnetization direction that causes the MTJ structure to have a variable resistance value. With the change of the magnetization direction of the free layer 130, the relative relationship of the magnetization directions of the free layer 130 and the pinned layer 150 also changes, which allows the variable resistance element 100 to store different data or represent different data bits. The free layer 130 may also be referred as a storage layer or the like. The magnetization direction of the free layer 130 may be substantially perpendicular to a surface of the free layer 130, the tunnel barrier layer 140 and the pinned layer 150. In other words, the magnetization direction of the free layer 130 may be substantially parallel to stacking directions of the free layer 130, the tunnel barrier layer 140 and the pinned layer 150. Therefore, the magnetization direction of the free layer 130 may be changed between a downward direction and an upward direction. The change in the magnetization direction of the free layer 130 may be induced by spin transfer torque.

The free layer 130 may have a single-layer or multilayer structure including a ferromagnetic material. In some implementations, the free layer 130 may include a first ferromagnetic material layer exhibiting a magnetization perpendicular to the first ferromagnetic material layer. For example, the free layer 130 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or the like, or may include a stack of metals, such as Co/Pt, or Co/Pd, or the like.

The tunnel barrier layer 140 may allow the tunneling of electrons in both data reading and data writing operations. In a write operation for storing new data, a high write current may be directed through the tunnel barrier layer 140 to change the magnetization direction of the free layer 130 and thus to change the resistance state of the MTJ for writing a new data bit. In a reading operation, a low reading current may be directed through the tunnel barrier layer 140 without changing the magnetization direction of the free layer 130 to measure the existing resistance state of the MTJ under the existing magnetization direction of the free layer 130 to read the stored data bit in the MTJ. The tunnel barrier layer 140 may include a dielectric oxide, for example, an oxide such as MgO, CaO, SrO, TiO, or VO, or NbO or the like.

The pinned layer 150 may have a pinned magnetization direction which is different from the magnetization direction of the free layer 130, and may be referred to as a reference layer or the like. In some implementations, the pinned layer 150 includes a second ferromagnetic material layer exhibiting a magnetization perpendicular to the second ferromagnetic material layer. In FIG. 1, the magnetization direction of the pinned layer 150 is shown as pinned in a downward direction. In some implementations, unlike that shown in FIG. 1, the magnetization direction of the pinned layer 150 may be pinned in an upward direction.

The pinned layer 150 may have a single-layer or multilayer structure including a ferromagnetic material. For example, the pinned layer 150 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

If a voltage or current is applied to the variable resistance element 100, the magnetization direction of the free layer 130 may be changed by spin torque transfer. When the magnetization directions of the free layer 130 and the pinned layer 150 are parallel to each other, the variable resistance element 100 may be in a low resistance state to store a particular designated digital data bit such as '0'. When the magnetization directions of the free layer 130 and the pinned layer 150 are anti-parallel to each other, the variable resistance element 100 may be in a high resistance state to store a different designated digital data bit such as '1'. In some implementations, the variable resistance element 100 can be configured to store data bit '1' when the magnetization directions of the free layer 130 and the pinned layer 150 are parallel to each other and to store data bit '0' when the magnetization directions of the free layer 130 and the pinned layer 150 are anti-parallel to each other.

In some implementations, the variable resistance element 100 may further include one or more layers performing various functions to improve a characteristic of the MTJ structure. For example, the variable resistance element 100 may further include a buffer layer 105 (see, FIG. 2), a perpendicular magnetic anisotropy increasing layer (PIL) 110, an under layer 120, a spacer layer 160, a magnetic correction layer 170 or a capping layer 180, or a combination thereof.

The capping layer 180 may function as a hard mask for patterning the variable resistance element 100 and include various conductive materials such as a metal. In some implementations, the capping layer 180 may include a metallic material having almost none or a small number of pin holes and high resistance to wet and/or dry etching. For example, the capping layer 180 may include a noble metal such as ruthenium (Ru).

The magnetic correction layer 170 may serve to offset the effect of the stray magnetic field produced by the pinned layer 150. In this case, the effect of the stray magnetic field of the pinned layer 150 can decrease, and thus a biased magnetic field in the free layer 130 can decrease. The magnetic correction layer 170 may have a magnetization direction anti-parallel to the magnetization direction of the pinned layer 150. In the implementation, when the pinned layer 150 has a downward magnetization direction, the magnetic correction layer 170 may have an upward magnetization direction. When the pinned layer 150 has an upward magnetization direction, the magnetic correction layer 170 may have a downward magnetization direction. The magnetic correction layer 170 may have a single-layer or multilayer structure including a ferromagnetic material.

In this implementation, the magnetic correction layer 170 is located above the pinned layer 150, but the position thereof may be changed. For example, the magnetic correction layer 170 may also be located above, below, or next to the MTJ structure while it is patterned separately from the MTJ structure.

The spacer layer 160 may be interposed between the magnetic correction layer 170 and the pinned layer 150 and function as a buffer therebetween. Further, the spacer layer 160 may serve to improve characteristics of the magnetic correction layer 170. The spacer layer 160 may include a noble metal such as ruthenium (Ru).

The under layer 120 may be disposed under the free layer 130 and serve to improve perpendicular magnetic anisotropy of the free layer 130. The perpendicular magnetic anisotropy (Hk) is a key feature of a ferromagnetic material playing a crucial role in properties of the free layer 130.

In this implementation, the under layer 120 may be formed of or include a material having a crystal structure of NaCl. The material having a crystal structure of NaCl may include a metal oxide having a crystal structure of NaCl. For example, the under layer 120 may be formed of or include MgO or ZnO, or a combination thereof but is not limited thereto.

In accordance with a conventional variable resistance element, the under layer 120 is formed of or includes a metal oxide. However, the metal oxide does not significantly or sufficiently increase perpendicular magnetic anisotropy (Hk) and perpendicular magnetic anisotropy generated at an interface between the under layer 120 and the free layer 130 is not high enough and rather low. The reasons are as follows. First, perpendicular magnetic anisotropy generated at an interface between the under layer 120 and the free layer 130 is fundamentally lower than perpendicular magnetic anisotropy generated due to an Fe—O orbital binding between the free layer 130 and the tunnel barrier layer 140. Second, the metal oxide included in the under layer 120 does not sufficiently function to improve perpendicular magnetic anisotropy of the free layer 130.

In this implementation, in order to improve or increase perpendicular magnetic anisotropy (Hk) of the free layer 130, the variable resistance element 100 may further include a perpendicular magnetic anisotropy increasing layer (PIL) 110 disposed below the under layer 120. The perpendicular magnetic anisotropy increasing layer (PIL) 110 operates to improve crystal orientation at an interface between the under layer 120 and the free layer 130 so as to increase perpendicular magnetic anisotropy (Hk) of the free layer 130, resulting in improving characteristics of the variable resistance element 100.

The perpendicular magnetic anisotropy increasing layer (PIL) 110 may be formed of or include a material having a different crystal structure from the under layer 120. The perpendicular magnetic anisotropy increasing layer (PIL) 110 may be formed of or include a material having a face centered cubic (FCC) crystal structure. The material having a face centered cubic (FCC) crystal structure may include a metal nitride having an FCC crystal structure. For example, the perpendicular magnetic anisotropy increasing layer (PIL) 110 may be formed of or include TiN, ZrN, HfN, or MoN, or a combination thereof but is not limited thereto.

Figure 2:
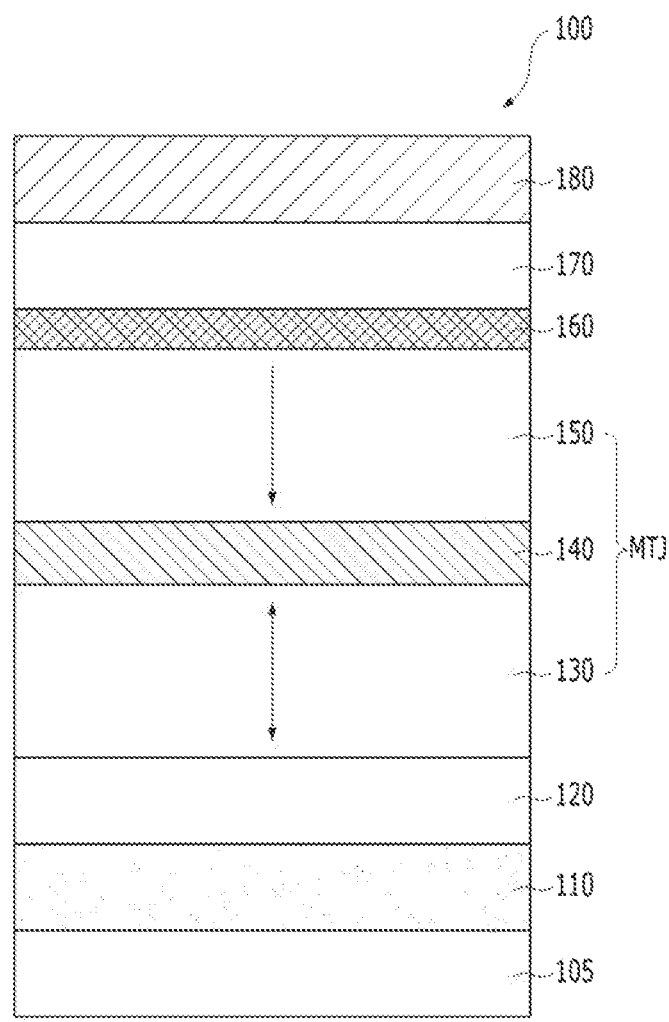
FIG. 2 is a cross-sectional view illustrating a variable resistance element in accordance with another implementation of the present disclosure.

FIG. 2 is a cross-sectional view illustrating a variable resistance element in accordance with another implementation of the present disclosure. The following descriptions will be focused on a difference from the implementation of FIG. 1.

Referring to FIG. 2, in comparison to the implementation of FIG. 1, the variable resistance element 100 may further include a buffer layer 105 disposed below the perpendicular magnetic anisotropy increasing layer (PIL) 110. That is, in this implementation, the perpendicular magnetic anisotropy increasing layer (PIL) 110 may be interposed between the under layer 120 and the buffer layer 105.

The buffer layer 105 may be formed below the under layer 120 and the perpendicular magnetic anisotropy increasing layer (PIL) 110 so as to operate to facilitate crystal growth of the layers disposed above the buffer layer 105. As a result, it is possible to further improve perpendicular magnetic anisotropy (Hk) of the free layer 130.

The buffer layer 105 may be formed of or include a material having a hexagonal close packed (HCP) crystal structure. The material having a hexagonal close packed (HCP) crystal structure may include a metal having material having a hexagonal close packed (HCP) crystal structure. For example, the buffer layer 105 may be formed of or include Mg, Zr, Hf, Ru, or Os, or a combination thereof but is not limited thereto.

In accordance with the implementation, the perpendicular magnetic anisotropy increasing layer (PIL) 110 may be interposed between the under layer 120 and the buffer layer 105 and further assist to increase perpendicular magnetic anisotropy of the free layer 130. In some implementations, although the device includes the under layer 120 and the buffer layer 105 that are provided according to an implementation of the disclosed technology, perpendicular magnetic anisotropy of the free layer 130 may still need to be increased. In this case, the perpendicular magnetic anisotropy increasing layer (PIL) 110 operates to compensate for the insufficient effect by the under layer 120 and the buffer layer 105 and further improve or increase perpendicular magnetic anisotropy of the free layer 130. The perpendicular magnetic anisotropy increasing layer (PIL) 110 may operate to improve crystal orientation at an interface between the under layer 120 and the free layer 130 and thus increase perpendicular magnetic anisotropy (Hk) of the free layer 130. As a result, characteristics of the variable resistance element 100 can be improved.

In the variable resistance element 100 in accordance with the above implementation, the free layer 130 is formed below the pinned layer 150. In other implementations, the free layer 130 can be formed above the pinned layer 150.

Advantages which can be obtained by forming the perpendicular magnetic anisotropy increasing layer (PIL) 110 below the under layer 120, or between the under layer 120 and the buffer layer 105 in the variable resistance element 100 will be described in detail with reference to FIG. 3.

Figure 3:
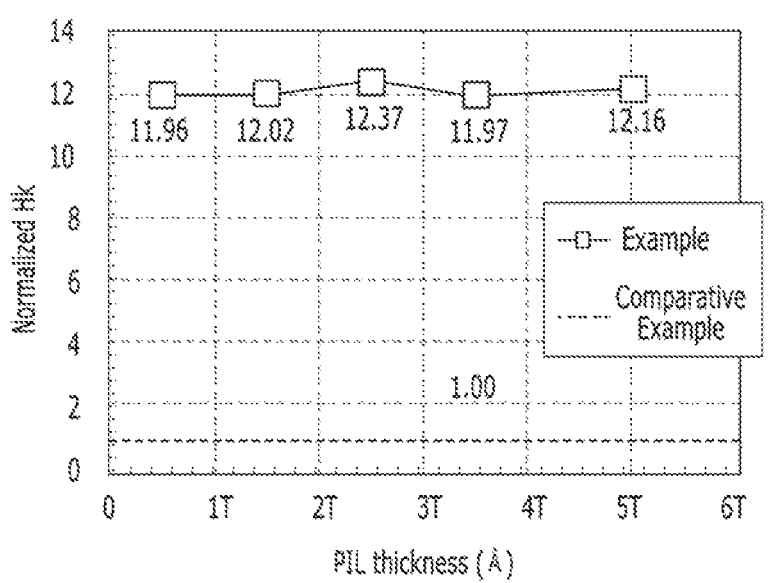
FIG. 3 shows graphs illustrating perpendicular magnetic anisotropy (Hk) of free layers in accordance with an implementation of the present disclosure and a comparative example.

FIG. 3 shows graphs illustrating perpendicular magnetic anisotropy of free layers in accordance with an implementation of the present disclosure and a comparative example. In FIG. 3, the horizontal axis indicates a thickness (A) of the perpendicular magnetic anisotropy increasing layer, and the vertical axis indicates normalized Hk (perpendicular anisotropy field) value. In the comparative example, the metal buffer layer and the metal oxide under layer are sequentially formed, and then the free layer is formed over the under layer. In the exemplary implementation of the disclosed technology, the buffer layer 105 having a HCP crystal structure, the perpendicular magnetic anisotropy increasing layer 110 having an FCC crystal structure and the under layer 120 having a crystal structure of NaCl are sequentially formed, and then the free layer 130 is formed over the under layer.

Referring to FIG. 3, perpendicular magnetic anisotropy of the free layer 130 can be remarkably improved by forming the perpendicular magnetic anisotropy increasing layer 110 having an FCC crystal structure between the buffer layer having a HCP crystal structure and the under layer 120 having a crystal structure of NaCl. This is because crystal orientation at an interface between the under layer and the free layer 130 is improved due to the perpendicular magnetic anisotropy increasing layer 110, resulting in improving perpendicular magnetic anisotropy of the free layer 130.

Moreover, the thermal stability of the free layer 130 can be increased due to the improvement of perpendicular magnetic anisotropy of the free layer 130. For reference, the thermal stability may be expressed by the equation (1):

$$\Delta = \frac{Ms * t * S * Hk}{2k_B T} \quad \text{[Equation 1]}$$

wherein, S indicates an area of the free layer, $k_B$ indicates Boltzmann constant and T indicates a temperature.

With reference to equation (1), since the thermal stability is proportional to the Hk value of the free layer, if the Hk value is increased, the thermal stability is also increased.

Based on the above, the variable resistance element 100 as suggested in the implementations of the disclosed technology makes it possible to increase crystal orientation at an interface between the under layer 120 and the free layer 130 and improve perpendicular magnetic anisotropy (Hk) of the free layer 130 by forming the perpendicular magnetic anisotropy increasing layer 110 having an FCC crystal structure below the under layer 120, or between the under layer 120 and the buffer layer 105. Moreover, it is possible to secure high thermal stability. As a result, data storage characteristics and operating characteristics of the variable resistance element 100 can be improved.

A semiconductor memory device as disclosed in this document may include a cell array of variable resistance elements 100 to store data. The semiconductor memory may further include various components such as lines, elements, etc. to drive or control each variable resistance element 100. This is exemplarily explained with reference to FIGS. 4 and 5.

Figure 4:
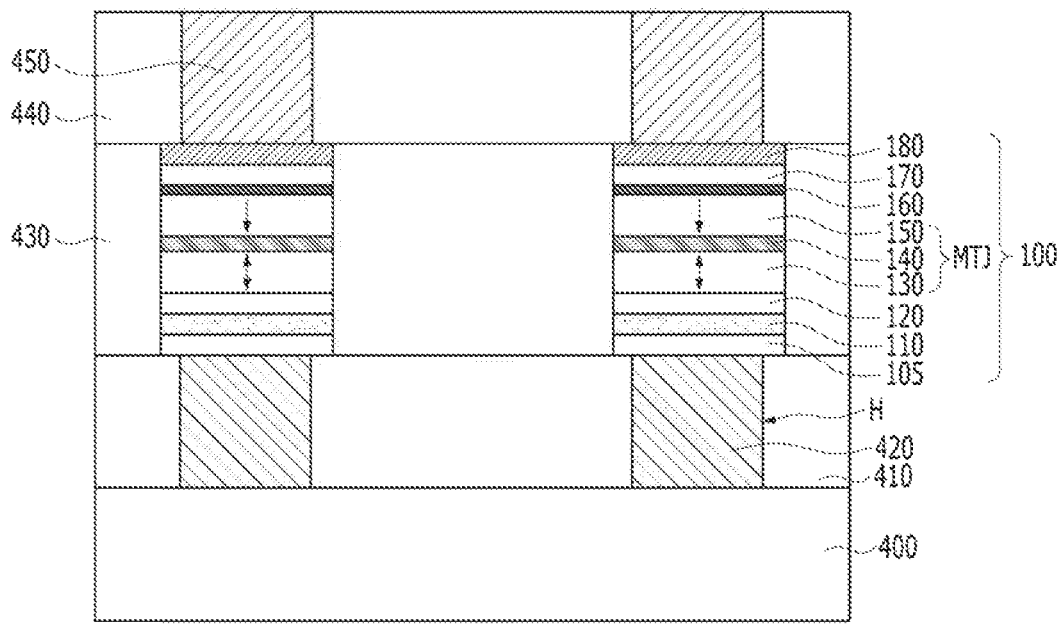
FIG. 4 is a cross-sectional view for explaining a memory device and a method for fabricating the same in accordance with an implementation of the present disclosure.

FIG. 4 is a cross-sectional view for explaining a memory device and a method for fabricating the same in accordance with an implementation of the present disclosure.

Referring to FIG. 4, the memory device of the implementation may include a substrate 400, lower contacts 420 formed over the substrate 400, variable resistance elements 100 formed over the lower contacts 420 and upper contacts 450 formed over the variable resistance element 100. For each variable resistance element 100, a specific structure as a switch or switching circuit/element, for example, a transistor, for controlling an access to a particular variable resistance element 100 can be provided over the substrate 400 to control the variable resistance element 100, where the switch can be turned on to select the variable resistance element 100 or turned off to de-select the variable resistance element 100. The lower contacts 420 may be disposed over the substrate 400, and couple a lower end of the variable resistance element 100 to a portion of the substrate 400, for example, a drain of the transistor as the switching circuit for the variable resistance element 100. The upper contact 480 may be disposed over the variable resistance element 100, and couple an upper end of the variable resistance element 100 to a certain line (not shown), for example, a bit line. In FIG. 4, two variable resistance elements 100 are shown as examples of the elements in an array of variable resistance elements 100.

The above memory device may be fabricated by following processes.

First, the substrate 400 in which the transistor or the like is formed may be provided, and then, a first interlayer dielectric layer 410 may be formed over the substrate 400. Then, the lower contact 420 may be formed by selectively etching the first interlayer dielectric layer 410 to form a hole H exposing a portion of the substrate 400 and filling the hole H with a conductive material. Then, the variable resistance element 100 may be formed by forming material layers for the variable resistance element 100 over the first interlayer dielectric layer 410 and the lower contact 420, and selectively etching the material layers. The etching process for forming the variable resistance element 100 may include the IBE method which has a strong physical etching characteristic. Then, a second interlayer dielectric layer 430 may be formed to cover the variable resistance element. Then, a third interlayer dielectric layer 440 may be formed over the variable resistance element 100 and the second interlayer dielectric layer 430, and then upper contacts 450 passing through the third interlayer dielectric layer 440 and coupled to an upper end of the variable resistance element 100 may be formed.

In the memory device in accordance with this implementation, all layers forming the variable resistance element 100 may have sidewalls which are aligned with one another. That is because the variable resistance element 100 is formed through an etching process using one mask.

Unlike the implementation of FIG. 4, a part of the variable resistance element 100 may be patterned separately from other parts. This process is illustrated in FIG. 5.

Figure 5:
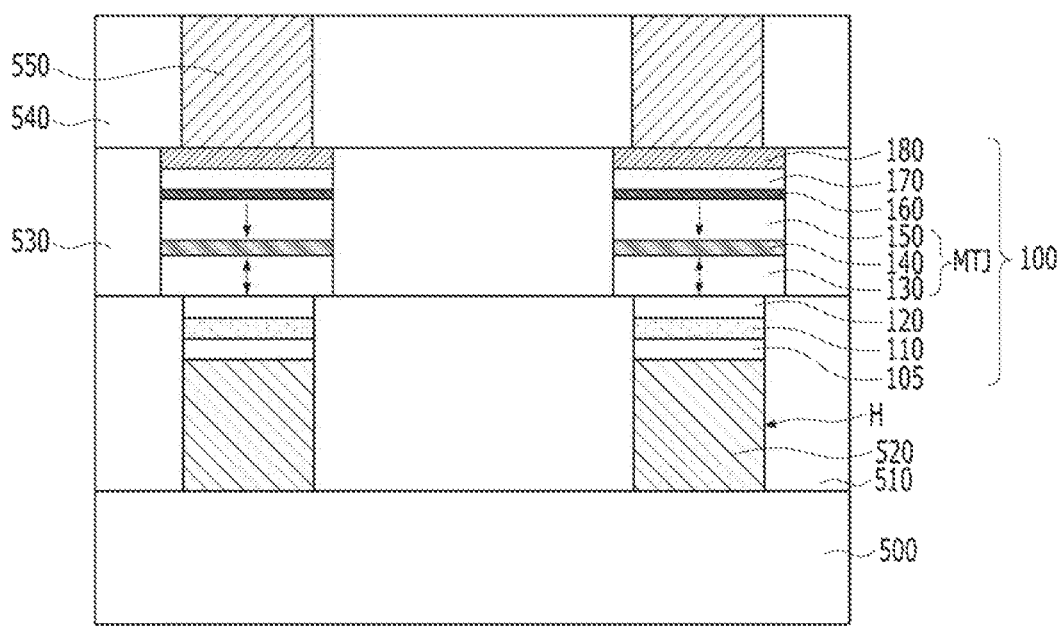
FIG. 5 is a cross-sectional view for explaining a memory device and a method for fabricating the same in accordance with another implementation of the present disclosure.

FIG. 5 is a cross-sectional view for explaining a memory device and a method for fabricating the same in accordance with another implementation of the present disclosure. The following descriptions will be focused on a difference from the implementation of FIG. 4.

Referring to FIG. 5, the memory device in accordance with this implementation may include a variable resistance element 100 of which parts, for example, a buffer layer 105, a perpendicular anisotropy increasing layer (PIL) 110 and an under layer 120 have sidewalls that are not aligned with other layers thereof. As shown in FIG. 5, the buffer layer 105, the perpendicular anisotropy increasing layer (PIL) 110 and the under layer 120 may have sidewalls which are aligned with lower contacts 520.

The memory device in FIG. 5 may be fabricated by following processes.

First, a first interlayer dielectric layer 510 may be formed over a substrate 500, and then selectively etched to form a hole H exposing a portion of the substrate 500. The, the lower contacts 520 may be formed to fill a lower portion of the hole H. For example, the lower contacts 520 may be formed through a series of processes of forming a conductive material to cover the resultant structure having the hole formed therein, and removing a part of the conductive material through an etch back process or the like until the conductive material has a desired thickness. Then, the buffer layer 105, the perpendicular anisotropy increasing layer (PIL) 110 and the under layer 120 may be formed so as to fill the remaining portion the hole H. For example, the buffer layer 105 may be formed by forming a material layer for forming the buffer layer 105 which covers the resultant structure in which the lower contacts 520 is formed, and then removing a portion of the material layer by, for example, an etch-back process until the material layer has a desired thickness. The perpendicular anisotropy increasing layer (PIL) 110 may be formed by forming a material layer for forming the PIL 110 which covers the resultant structure in which the lower contacts 520 and the buffer layer 105 are formed, and then removing a portion of the material layer by, for example, an etch-back process until the material layer has a desired thickness. Moreover, the under layer 120 may be formed by forming a material layer for forming the under layer 120 which covers the resultant structure in which the lower contacts 520, the buffer layer 105 and the PIL 110 are formed, and then performing a planarization process such as a CMP (Chemical Mechanical Planarization) until a top surface of the first interlayer dielectric layer 510 is exposed. Then, the remaining parts of the variable resistance element 100 may be formed by forming material layers for forming the remaining layers of the variable resistance element 100 except the buffer layer 110 and the under layer 120 over the lower contacts 520 and the first interlayer dielectric layer 510. Subsequent processes are substantially the same as those as shown in FIG. 4.

In this implementation, the height which needs to be etched at a time in order to form the variable resistance element 100 can be reduced, which makes it possible to lower the difficulty level of the etching process.

Although in this implementation, the buffer layer 105, the perpendicular anisotropy increasing layer (PIL) 110 and the under layer 120 are buried in the hole H, other parts of the variable resistance element 100 may also be buried as needed.

The above and other memory circuits or semiconductor devices based on the disclosed technology can be used in a range of devices or systems. FIGS. 6 to 10 provide some examples of devices or systems that can implement the memory circuits disclosed herein.

Figure 6:
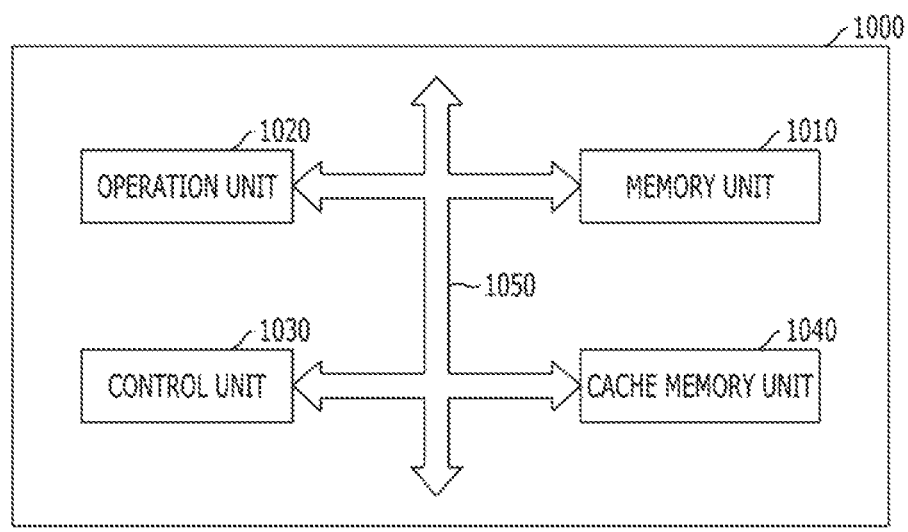
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
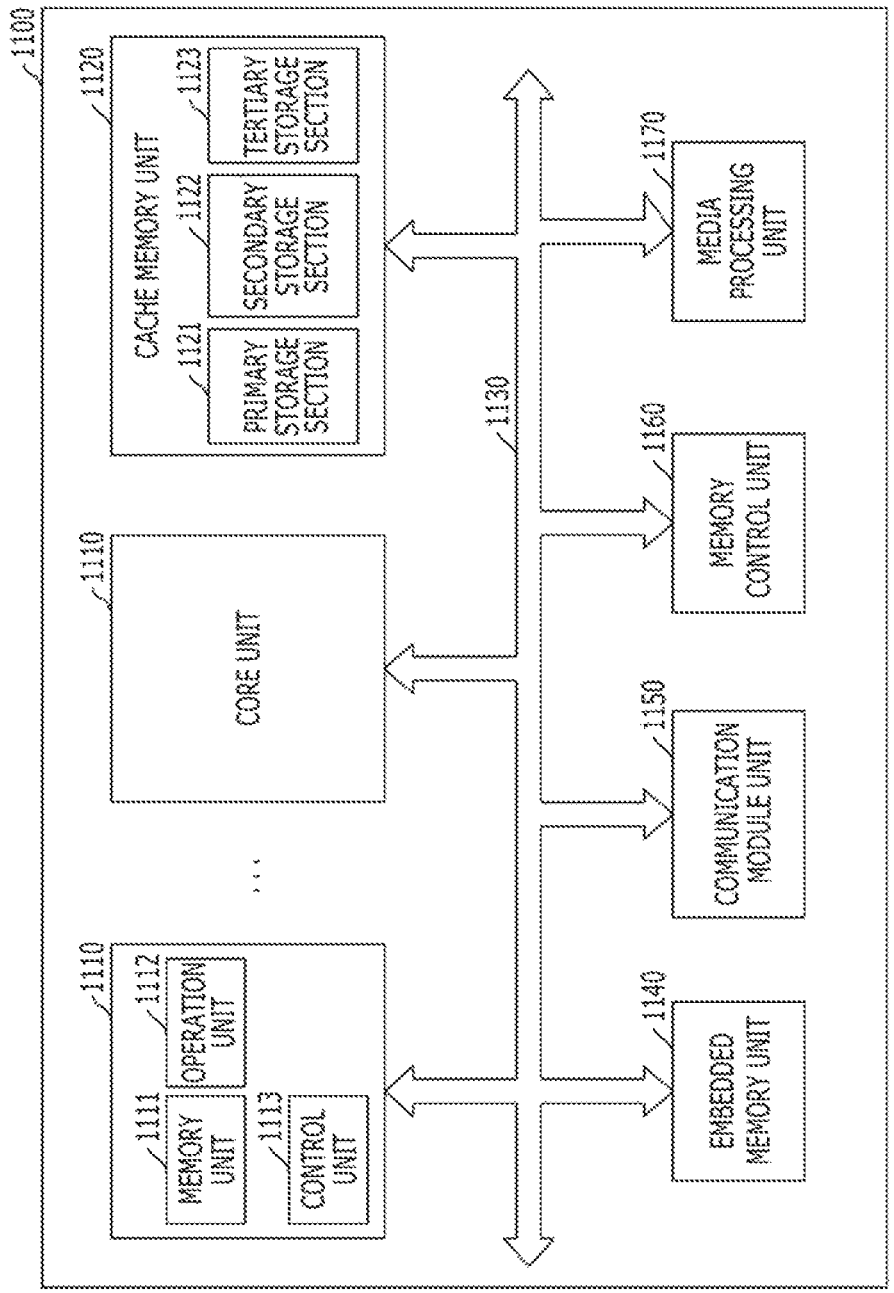
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer. Through this, data storage characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
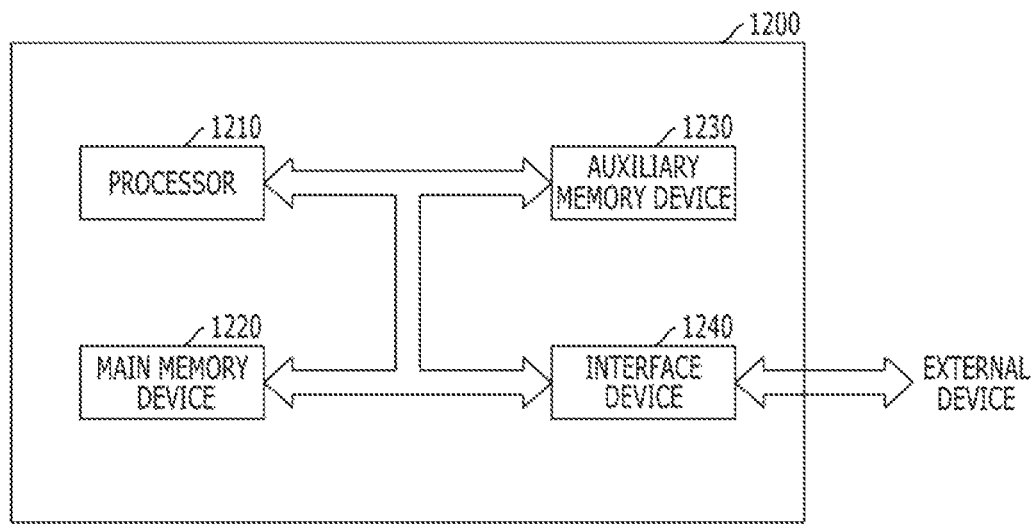
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
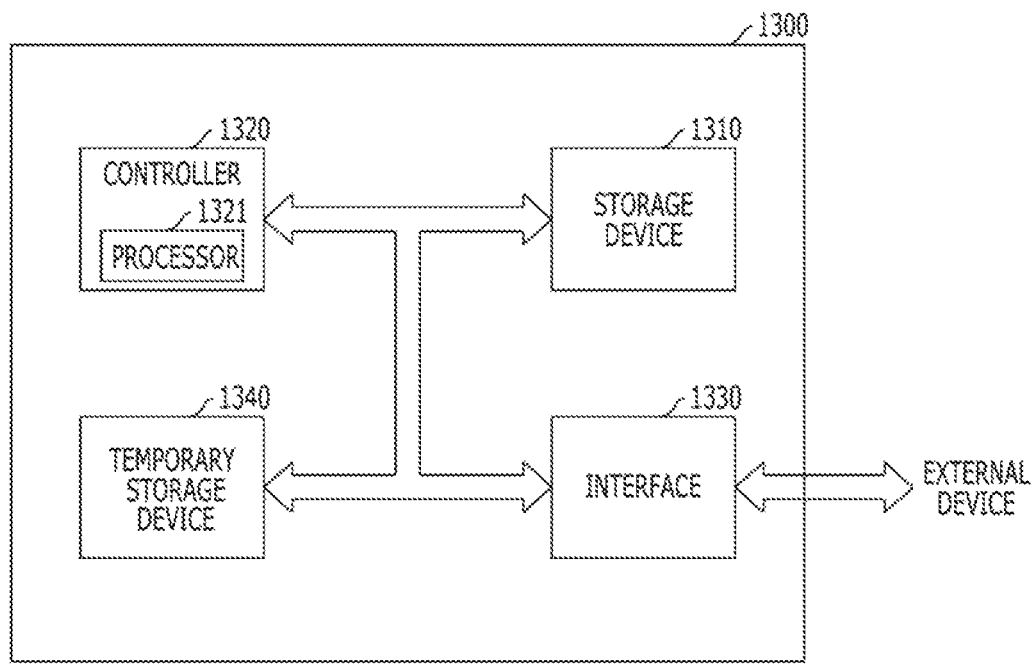
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer. Through this, data storage characteristics of the storage device 1310 or the temporary storage device 1340 may be improved. As a consequence, operating characteristics and data storage characteristics of the data storage system 1300 may be improved.

Figure 10:
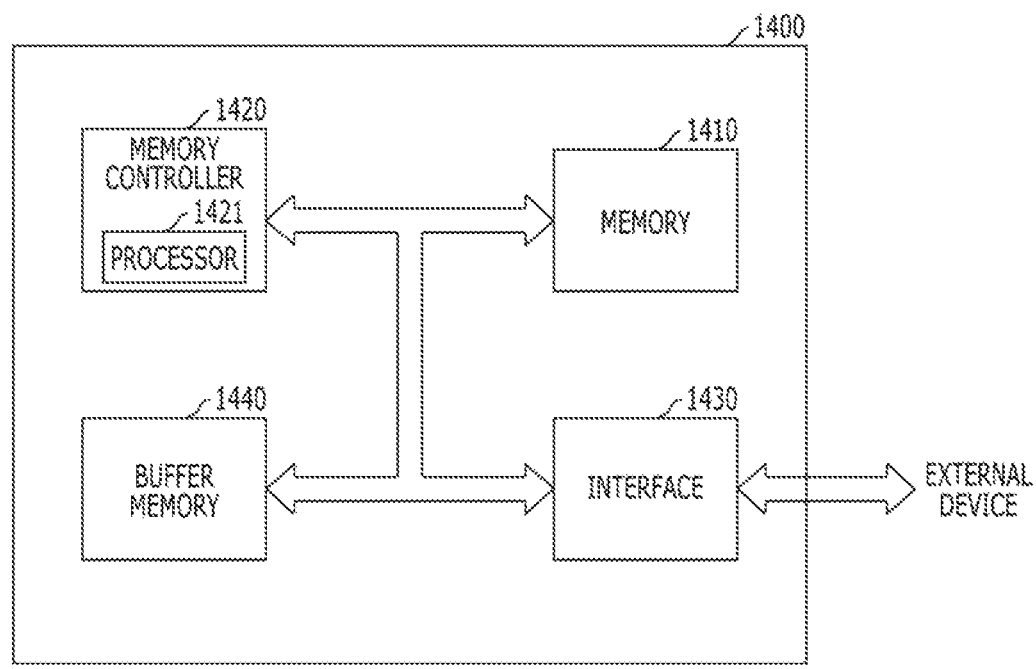
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an MTJ (Magnetic Tunnel Junction) structure including a free layer having a variable magnetization direction, a pinned layer having a fixed magnetization direction, and a tunnel barrier layer interposed between the free layer and the pinned layer; an under layer disposed under the MTJ structure; and a perpendicular magnetic anisotropy increasing layer disposed below the under layer and including a material having a different crystal structure from the under layer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
a magnetic tunnel junction (MTJ) structure including a free layer having a variable magnetization direction perpendicular to the free layer, a pinned layer having a fixed magnetization direction perpendicular to the pinned layer, and a tunnel barrier layer interposed between the free layer and the pinned layer;
an under layer disposed under the MTJ structure;
a perpendicular magnetic anisotropy increasing layer disposed below the under layer and including a material having a different crystal structure from the under layer; and
a buffer layer disposed below the perpendicular magnetic anisotropy increasing layer and including a material having a different crystal structure from the perpendicular magnetic anisotropy increasing layer.

2. The electronic device of claim 1, wherein the under layer includes a material having a crystal structure of NaCl.

3. The electronic device of claim 2, wherein the under layer includes a metal oxide having a crystal structure of NaCl.

4. The electronic device of claim 3, wherein the under layer includes MgO, or ZnO, or a combination thereof.

5. The electronic device of claim 1, wherein the perpendicular magnetic anisotropy increasing layer includes a material having a face centered cubic (FCC) crystal structure.

6. The electronic device of claim 5, wherein the perpendicular magnetic anisotropy increasing layer includes a metal nitride having a face centered cubic (FCC) crystal structure.

7. The electronic device of claim 6, wherein the perpendicular magnetic anisotropy increasing layer includes TiN, ZrN, HfN, or MoN, or a combination thereof.

8. The electronic device of claim 1, wherein the buffer layer operates to facilitate crystal growth of the layers disposed over the buffer layer.

9. The electronic device of claim 8, wherein the buffer layer includes a material having a hexagonal close packed (HCP) crystal structure.

10. The electronic device of claim 9, wherein the buffer layer includes Mg, Zr, Hf, Ru, or Os, or a combination thereof.

11. An electronic device comprising a semiconductor memory, wherein the semiconductor memory comprises:
a substrate;
memory cells formed over the substrate, each memory cell including a magnetic layer, an under layer disposed below the magnetic layer, a perpendicular magnetic anisotropy increasing layer disposed below the under layer and structured to have a crystal structure that is different from a crystal structure of the under layer, and a buffer layer disposed below the perpendicular magnetic anisotropy increasing layer and including a material having a different crystal structure from the perpendicular magnetic anisotropy increasing layer; and
switching elements formed over the substrate and coupled to the memory cells to select or de-select the memory cells.

12. The electronic device of claim 11, wherein each memory cell includes a magnetic tunnel junction (MTJ) structure that includes the magnetic layer, the under layer and the perpendicular magnetic anisotropy increasing layer.

13. The electronic device of claim 11, wherein the under layer includes a material having a crystal structure of NaCl.

14. The electronic device of claim 13, wherein the under layer includes a metal oxide having a crystal structure of NaCl.

15. The electronic device of claim 14, wherein the under layer includes MgO, or ZnO, or a combination thereof.

16. The electronic device of claim 11, wherein the perpendicular magnetic anisotropy increasing layer includes a material having a face centered cubic (FCC) crystal structure.

17. The electronic device of claim 16, wherein the perpendicular magnetic anisotropy increasing layer includes a metal nitride having a face centered cubic (FCC) crystal structure.

18. The electronic device of claim 17, wherein the perpendicular magnetic anisotropy increasing layer includes TiN, ZrN, HfN, or MoN, or a combination thereof.

19. The electronic device of claim 11, wherein the buffer layer operates to facilitate crystal growth of the layers disposed over the buffer layer.

20. The electronic device of claim 19, wherein the buffer layer includes a material having a hexagonal close packed (HCP) crystal structure.

* * * * *